(12) United States Patent
Xie et al.

(10) Patent No.: US 10,101,375 B2
(45) Date of Patent: Oct. 16, 2018

(54) SEPARATED PARTICLE CHARGE MULTIVARIATE ANALYSIS INSTRUMENT

(71) Applicant: LANZHOU UNIVERSITY, Lanzhou, Gansu Province (CN)

(72) Inventors: Li Xie, Lanzhou (CN); Kui Han, Lanzhou (CN)

(73) Assignee: LANZHOU UNIVERSITY, Lanzhou (CN)

( * ) Notice: Subject to any disclaimer, the term of this patent is extended or adjusted under 35 U.S.C. 154(b) by 279 days.

(21) Appl. No.: 15/110,728

(22) PCT Filed: Jan. 9, 2015

(86) PCT No.: PCT/CN2015/000021
§ 371 (c)(1),
(2) Date: Jul. 8, 2016

(87) PCT Pub. No.: WO2016/109906
PCT Pub. Date: Jul. 14, 2016

(65) Prior Publication Data
US 2016/0363618 A1 Dec. 15, 2016

(51) Int. Cl.
*G01N 27/62* (2006.01)
*G01R 29/24* (2006.01)

(52) U.S. Cl.
CPC .................... *G01R 29/24* (2013.01)

(58) Field of Classification Search
CPC .......... G01R 29/24; H01J 37/08; H01J 49/282
USPC .................................. 324/453, 459
See application file for complete search history.

(56) References Cited

FOREIGN PATENT DOCUMENTS

| CN | 2586155 Y | * | 11/2003 | ............... G01N 3/12 |
|---|---|---|---|---|
| CN | 2586155 Y | | 11/2003 | |
| CN | 102360043 A | * | 2/2012 | ............ G01R 29/24 |
| CN | 102360043 A | | 2/2012 | |
| CN | 202149923 U | | 2/2012 | |
| CN | 202166696 U | | 3/2012 | |
| CN | 203084086 U | | 7/2013 | |
| CN | 103714629 A | | 4/2014 | |
| JP | 05126883 A | | 5/1993 | |

* cited by examiner

*Primary Examiner* — Melissa Koval
*Assistant Examiner* — Courtney McDonnough
(74) *Attorney, Agent, or Firm* — Jiwen Chen

(57) ABSTRACT

The separated particle charge multivariate analysis instrument includes a transparent sealed container and, inside the transparent sealed container, an axial fan, a tube carrier plate, a rail board, double screw shafts, a biaxial motor, parallel electrode plates and so on. The separated particle charge multivariate analysis instrument of the present invention measures out the charge amount of the particle after leaving the particle bed by simulating a controllable environmental factor in the transparent sealed container on the basis of the inner tube, the outer tube, the electrometer and the charge amount of the particle entering into the inner tube at the measurement site, and analyzes effects of environmental factors, particle physical parameters and geometric parameters to the charge by adjusting environmental variables in the transparent sealed container.

9 Claims, 1 Drawing Sheet

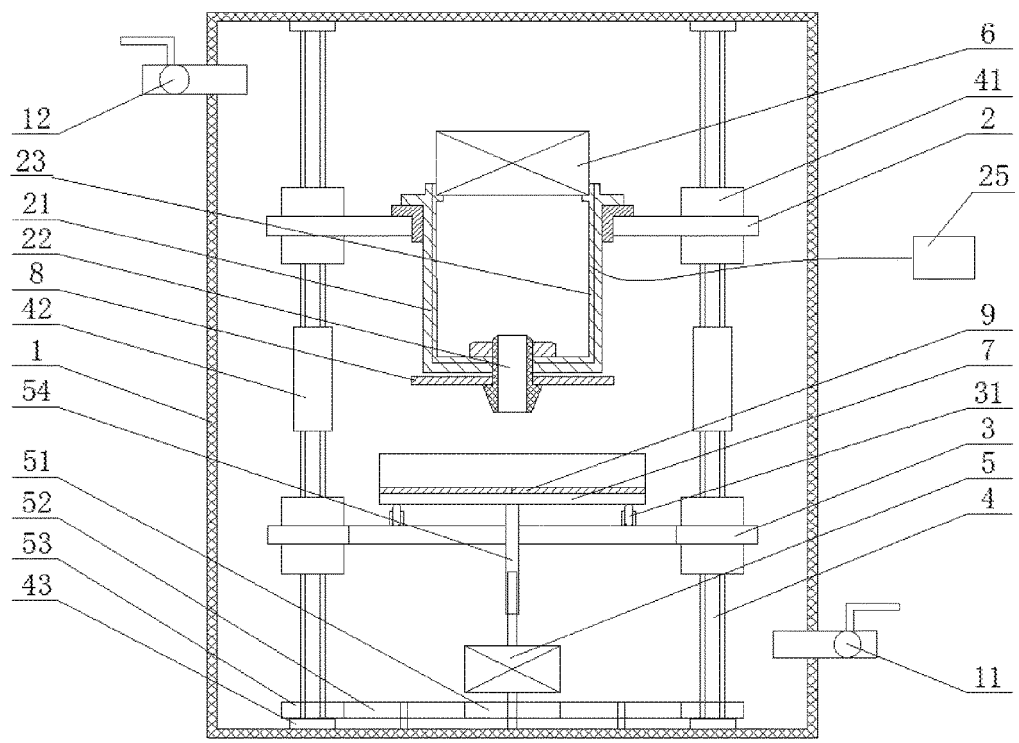

SEPARATED PARTICLE CHARGE MULTIVARIATE ANALYSIS INSTRUMENT

This is a U.S. national stage application of PCT Application No. PCT/CN2015/000021 under 35 U.S.C. 371, filed Jan. 9, 2015 in Chinese, which is hereby incorporated by reference.

TECHNICAL FIELD

The present invention relates to analytic instruments, in particular, to separate particle electric charge multivariate analysis instrument.

BACKGROUND ART

Particles leaving the surface of a bed of particles have positive and negative charges due to their environmental factors, particle physical parameters and geometric parameters, so that the amount of the charge of each particle varies. However, because currently there exists no measurement instrument to provide a direct measurement of charge amount of particles leaving the particle system, and therefore it is impossible to directly measure the charge amount of particles leaving the particle system, further to verify such charging mechanism, meanwhile to analyze effects of environmental factors, particle physical parameters and geometric parameters to the charge.

SUMMARY OF THE INVENTION

It is an object of the present invention to provide a separated particle charge multivariate analysis instrument according to the mentioned problems, to realize the measurement of the charge of particles after leaving the particle bed and advantages of analyzing effects of environmental factors, particle physical parameters and geometric parameters to the charge.

To realize the object, the present invention provides a separated particle charge multivariate analysis instrument comprising a transparent sealed container; an axial fan, a tube carrier plate, a rail board, double screw shafts, a biaxial motor, a Faraday cylinder and a couple of parallel electrode plates all located within the transparent sealed container.

The double screw shafts are arranged opposite to each other inside the transparent sealed container, and said tube carrier plate is mounted on upper portions of the couple of screw shafts through threaded sleeves, and said rail board is mounted on lower portions of the couple of screw shafts through other threaded sleeves. The screw rotation direction of said upper portions of said double screw shafts is opposite to the screw rotation direction of the lower portions of said double screw shafts, so that said double screw shafts can rotate to increase or decrease the distance between the tube carrier plate and rail board;

Said biaxial motor is vertically mounted at the bottom center of the transparent sealed container, and a drive gear is attached to the lower output shaft of said biaxial motor, and said drive gear is connected, via a transmission gear on each of the opposite sides, between a couple of driven gear mounted on the double screw shafts respectively, so as to rotate said double screw shafts;

The upper output shaft of said biaxial motor is engaged through a telescopic shaft to the bottom center of a loader mounted on the rail board, and a plurality of rail wheels are provided on said upper rail board to support said loader;

Said Faraday tube is mounted on said tube carrier plate, including an inner tube and an outer tube. The outer tube is connected to the ground on one end and the top of the outer tube is mounted with said axial fan, and the inlet of the Faraday tube comprises a hollow tapered head screw; said inner tube is engaged to an electrometer;

Said couple of parallel electrode plates include an upper electrode plate and a lower electrode plate. Said upper electrode plate is mounted at the bottom of the outer tube by the hollow tapered head screw, and said lower electrode plate is mounted above said loader, and said upper electrode plate and lower electrode plate are parallelly and coaxially configured.

Preferably, said transparent sealed container is provided with an inlet valve and an outlet valve, said inlet valve is located at the a lower portion of the side walls of said transparent sealed container, and said outlet valve is located at an upper portion of the side walls of said transparent sealed container, thereby maximizing the distance between said inlet valve and outlet valve so that the sealed container can contain pure air at maximum amount.

Preferably, said inlet valve and said outlet valve are provided in different side walls of said transparent sealed container.

Preferably, a stop spacer is mounted with a middle portion of each of said double screw shafts, whose diameter is bigger than that of the other portions of said double screw shafts, so that said tube carrier plate may reach down upon the top of the stop spacer and then be stopped by force, while said rail board may reach the bottom of stop spacer and then be stopped, so as to prevent the upper electrode plate on tube carrier plate and lower electrode plate on rail board from direct collision.

Preferably, each side of said biaxial motor is mounted at the bottom of said transparent sealed container by a bracket.

Preferably, said at least three rail wheels are uniformly distributed around said telescopic shaft.

Preferably, each said double screw shafts at its top and bottom ends is respectively connected and fixed with screw fasteners to an internal wall of said transparent sealed container.

Preferably, the top of said Faraday tube is provided with said axial fan to separate the particles from the particle bed through the inlet of the hollow tapered head screw of the Faraday tube into the Faraday tube; the particle charge detected by the inner tube is displayed by the electrometer.

Preferably, said axial fan rotation speed determines the amount of particles entering into the inner tube.

The present invention or said separated particle charge multivariate analysis instrument measures the charge amount of the particles after leaving the particle bed by simulating a controllable environmental factor in the transparent sealed container on the basis of the inner tube, the outer tube, the electrometer and the charge amount of the particles entering into the inner tube at the measurement site, and analyzes effects of environmental factors, particle physical parameters and geometric parameters to the charge by adjusting environmental variables in the transparent sealed container.

BRIEF DESCRIPTION OF THE DRAWINGS

FIG. 1 represents a structure diagram of the present invention said separated particle charge multivariate analysis instrument.

NUMERICAL IDENTIFIER LIST:

1-Transparent sealed container; 11-Inlet valve; 12-Outlet valve; 2-Tube carrier plate; 21-Outer tube; 22-Hollow tapered head screw; 23-Inner tube; 25-Electrometer; 3-Rail board; 31-Rail wheel; 4-double screw shafts; 41-Threaded sleeve; 5-Biaxial motor; 51-Drive gear; 52-Transmission gear; 53-Driven gear; 54-Telescopic shaft; 6-Axial fan; 7-Loader; 8-Upper electrode plate; 9-Lower electrode plate.

DETAILED DESCRIPTION OF THE PREFERRED EMBODIMENT

According to the present invention, a separated particle charge multivariate analysis instrument comprises a transparent sealed container 1, an axial fan 6, a tube carrier plate 2, a rail board 3, a double screw shafts 4, a biaxial motor 5, a Faraday cylinder and a couple of parallel electrode plates, all located within the transparent sealed container.

Said double screw shafts 4 is arranged opposite to each other inside the transparent sealed Container 1, and said tube carrier plate 2 is mounted on upper portions of the double screw shafts 4 through threaded sleeves 41, and said rail board 3 is mounted on lower portions of the double screw shafts 4 with other threaded sleeves 41. The screw rotation direction of said upper portions of said double the screw shafts is opposite to the screw rotation direction of the lower portions of said double screw shafts, so that said double screw shafts 4 can rotate to increase or decrease the distance between the tube carrier plate 2 and rail board 3;

Said biaxial motor 5 is vertically mounted at the bottom center of the transparent sealed Container 1, and a drive gear 51 is attached to the lower output shaft of said biaxial motor 5, and said drive gear 51 is connected, via a transmission gear 52 on each of the opposite sides, between a couple of driven gear 53 mounted on the double screw shafts 4 respectively, so as to rotate said double screw shafts 4;

The upper output shaft of said biaxial motor 5 is engaged through a telescopic shaft 54 to the bottom center of a loader 7 mounted on the rail board, and a plurality of rail wheels 31 are provided on said upper rail board 3 to support said loader 7;

Said Faraday tube is mounted on said tube carrier plate 2, including an inner tube 23 and an outer tube 21. The outer tube is connected to the ground on one end and the top of the outer tube is mounted with said axial fan 6, and the inlet of the Faraday tube comprises a hollow tapered head screw 22; said inner tube 23 is engaged to an electrometer 25;

Said couple of parallel electrode plates include an upper electrode plate 8 and a lower electrode plate 9. Said upper electrode plate 8 is mounted at the bottom of the outer tube 21 by the hollow tapered head screw 22, and said lower electrode plate 9 is mounted above said loader 7, and said upper electrode plate 8 and lower electrode plate 9 are parallelly and coaxially configured.

Said transparent sealed container 1 is provided with an inlet valve 11 and an outlet valve 12, said inlet valve 11 is located at a lower portion of the side walls of said transparent sealed container 1, and said outlet valve 12 is located at an upper portion of the side walls of said transparent sealed container 1, thereby maximizing the distance between said inlet valve 11 and outlet valve 12 so that the sealed container can contain a pure air at maximum.

Said inlet valve 11 and said outlet valve 12 are provided in different side walls of said transparent sealed container 1.

A stop spacer 42 is mounted with a middle portion of each of said double screw shafts 4, whose diameter is bigger than that of the other portions of said double screw shafts 4, so that said tube carrier plate 2 may reach down upon the top of stop spacer 42 and then stopped by force, while said rail board 3 may reach the bottom of stop spacer 42 and then be stopped, so as to prevent the upper electrode plate 8 on tube carrier plate 2 and lower electrode plate 9 on rail board 3 from direct collision.

Each side of said biaxial motor 5 is mounted at the bottom of said transparent sealed container 1 by a bracket.

Said at least three rail wheels are uniformly distributed around said telescopic shaft.

Each said double screw shafts 4 at its top and bottom ends is respectively connected to and fixed with screw fastener 43 to an internal wall of said transparent sealed container 1.

The top of said Faraday tube is provided with said axial fan to separate the particles from the particle bed through the inlet of the hollow tapered head screw 22 of the Faraday tube into the Faraday tube; the particle charge detected by the inner tube 23 is displayed by the electrometer 25.

Said axial fan rotation speed determines the amount of particles entering into the inner tube 23.

The invention claimed is:

1. A separated particle charge multivariate analysis instrument, comprising a transparent sealed container (1); and an axial fan (6), a tube carrier plate (2), a rail board (3), double screw shafts (4), a biaxial motor (5), a Faraday cylinder and a couple of parallel electrode plates all located within the transparent sealed container; wherein said double screw shafts (4) are arranged opposite to each other inside the transparent sealed container (1), and said tube carrier plate (2) is mounted on upper portions of the double screw shafts (4) through threaded sleeves (41), and said rail board (3) is mounted on lower portions of the double screw shafts (4) through other threaded sleeves (41), screw rotation direction of said upper portion of said double the screw shafts is opposite to screw rotation direction of the lower portions of said double screw shafts, so that said double screw shafts (4) can rotate to increase or decrease the distance between the tube carrier plate (2) and rail board (3);

said biaxial motor (5) is vertically mounted at a bottom center of the transparent sealed container (1), and a drive gear (51) is attached to a lower output shaft of said biaxial motor (5), and said drive gear (51) is connected, via a transmission gear (52) on each of the opposite sides, between a couple of driven gear (53) mounted on the double screw shafts (4) respectively, so as to rotate said double screw shafts (4);

an upper output shaft of said biaxial motor (5) is engaged through a telescopic shaft (54) to a bottom center of a loader (7) mounted on the rail board, and a plurality of rail wheels (31) are provided on said upper rail board (3) to support said loader (7);

said Faraday tube is mounted on said tube carrier plate (2), including an inner tube (23) and an outer tube (21), the outer tube is connected to the ground on one end and a top of the outer tube is mounted with said axial fan (6), and the inlet of the Faraday tube comprises a hollow tapered head screw (22); said inner tube (23) is engaged to an electrometer (25);

said couple of parallel electrode plates include an upper electrode plate (8) and a lower electrode plate (9), said upper electrode plate (8) is mounted at the bottom of the outer tube (21) by the hollow tapered head screw (22), and said lower electrode plate (9) is mounted above said loader (7), and said upper electrode plate (8) and lower electrode plate (9) are parallelly and coaxially configured.

2. The separated particle charge multivariate analysis instrument set forth in claim 1 wherein said transparent sealed container (1) is provided with an inlet valve (11) and an outlet valve (12), said inlet valve (11) is located at a lower portion of the side walls of said transparent sealed container (1), and said outlet valve (12) is located at an upper portion of the side walls of said transparent sealed container (1), thereby maximizing the distance between said inlet valve (11) and outlet valve (12) so that the sealed container can contain pure air at maximum amount.

3. The separated particle charge multivariate analysis instrument set forth in claim 2 wherein said inlet valve (11) and said outlet valve (12) are provided in different side walls of said transparent sealed container (1).

4. The separated particle charge multivariate analysis instrument set forth in claim 1 wherein a stop spacer (42) is mounted with a middle portion of each of said double screw shafts (4), whose diameter is bigger than that of the other portions of said double screw shafts (4), so that said tube carrier plate (2) may reach down upon a top of a stop spacer (42) and then be stopped by force, while said rail board (3) may reach a bottom of the stop spacer (42) and then be stopped, so as to prevent the upper electrode plate (8) on tube carrier plate (2) and lower electrode plate (9) on rail board (3) from direct collision.

5. The separated particle charge multivariate analysis instrument set forth in claim 1 wherein each side of said biaxial motor (5) is mounted at the bottom of said transparent sealed container (1) by a bracket.

6. The separated particle charge multivariate analysis instrument set forth in claim 1 wherein said at least three rail wheels are uniformly distributed around said telescopic shaft.

7. The separated particle charge multivariate analysis instrument set forth in claim 1 wherein each of said double screw shafts (4) at its top and bottom ends is respectively connected and fixed with a screw fastener (43) to an internal wall of said transparent sealed container (1).

8. The separated particle charge multivariate analysis instrument set forth in claim 1 wherein the top of said Faraday tube is provided with said axial fan to separate the particles from the particle bed through the inlet of the hollow tapered head screw (22) of the Faraday tube into the Faraday tube; the particle charge detected by the inner tube (23) is displayed by the electrometer (25).

9. The separated particle charge multivariate analysis instrument set forth in claim 1 wherein said axial fan rotation speed determines the amount of particles entering into the inner tube (23).

\* \* \* \* \*